US011353528B2

(12) United States Patent
Fraundorfer et al.

(10) Patent No.: US 11,353,528 B2
(45) Date of Patent: Jun. 7, 2022

(54) MATERIAL DETECTION SYSTEM

(71) Applicant: Raytheon Company, Waltham, MA (US)

(72) Inventors: Joseph J. Fraundorfer, Bethesda, MD (US); Thomas G. Lavedas, Moneta, VA (US); Benjamin P. Dolgin, Alexandria, VA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/204,777

(22) Filed: Mar. 17, 2021

(65) Prior Publication Data

US 2021/0373098 A1    Dec. 2, 2021

Related U.S. Application Data

(60) Provisional application No. 63/030,048, filed on May 26, 2020.

(51) Int. Cl.
*G01R 33/44* (2006.01)
*G01R 33/36* (2006.01)

(52) U.S. Cl.
CPC ....... *G01R 33/441* (2013.01); *G01R 33/3607* (2013.01); *G01R 33/3621* (2013.01)

(58) Field of Classification Search
CPC ............. G01R 33/441; G01R 33/3607; G01R 33/3621; G01N 24/084
See application file for complete search history.

(56) References Cited

U.S. PATENT DOCUMENTS 5,206,592 A * 4/1993 Buess ................. G01R 33/441
324/318
7,714,791 B2    5/2010 Lavedas
(Continued)

FOREIGN PATENT DOCUMENTS

EP           2336754 A1    6/2011
WO      2005/106516 A2    11/2005

OTHER PUBLICATIONS

International Search Report dated Jul. 7, 2021 in connection with International Patent Application No. PCT/US2021/022826, 3 pages.
(Continued)

*Primary Examiner* — G. M. A. Hyder

(57) ABSTRACT

A system includes a table and a material detection system. The material detection system includes a transmit chain configured to generate first radio frequency (RF) signals and a transmit probe configured to transmit the first RF signals towards an item through open space. The material detection system also includes a receive probe configured to receive second RF signals from the item through open space, where the second RF signals have one or more characteristics indicative of one or more materials within the item. The material detection system further includes a receive chain configured to process the second RF signals and at least one processing device configured to identify the one or more materials within the item using nuclear quadrupole resonance (NQR) spectrometry based on the processed second RF signals. The transmit and receive probes are positioned in an upper portion of the table.

20 Claims, 7 Drawing Sheets

(56) References Cited

U.S. PATENT DOCUMENTS

| | | | |
|---|---|---|---|
| 8,717,242 | B2 | 5/2014 | Lavedas et al. |
| 9,484,632 | B2 | 11/2016 | Lavedas |
| 9,812,790 | B2 | 11/2017 | Lavedas |
| 10,340,965 | B2 | 7/2019 | Dolgin et al. |
| 2005/0270028 | A1 | 12/2005 | Alvarez et al. |
| 2006/0122484 | A1* | 6/2006 | Itozaki ............... G01R 33/441 600/409 |
| 2018/0315539 | A1 | 11/2018 | Dolgin et al. |
| 2019/0195973 | A1 | 6/2019 | Dolgin et al. |

OTHER PUBLICATIONS

Written Opinion of the International Searching Authority dated Jul. 7, 2021 in connection with International Patent Application No. PCT/US2021/022826, 8 pages.
Alegre Science, "Sodium Analyzer Without Sample Prep Fast Sodium Analysis in Food and Liquids", 2016, 7 pages.
Morpho Detection, LLC, "Itemiser DX," Explosives and Narcotics Detection, 2014, 2 pages.
Morpho Detection, Inc., "MobileTrace—Carry More Detection Power," 2013, 4 pages.
Smiths Detection, "Efficient Air Cargo Solutions", 2019, 7 pages.
Smiths Detection, "Your Complete Hold Baggage Solution", 2019, 5 pages.
Smiths Detection, "The Smart Checkpoint Solution", 2019, 11 pages.
L3 Security & Detection Systems, "ProVision 2—Compact Image-free Advanced Personnel Screening", Fact Sheet, 2017, 1 page.
American Science and Engineering, Inc., "Cargo and Vehicle—Multi-View X-ray Screening System", 2009, 2 pages.
Rapiscan Systems, "920 CT," 2018, 2 pages.
Brailovsky et al., "Electronic Control of RFI in a Near-Field Probe Antenna", U.S. Appl. No. 62/348,392, 6 pages.

* cited by examiner

MATERIAL DETECTION SYSTEM

CROSS-REFERENCE TO RELATED APPLICATION AND PRIORITY CLAIM

This application claims priority under 35 U.S.C. § 119(e) to U.S. Provisional Patent Application No. 63/030,048 filed on May 26, 2020, which is hereby incorporated by reference in its entirety.

TECHNICAL FIELD

This disclosure relates generally to inspection systems. More specifically, this disclosure relates to a material detection system.

BACKGROUND

Several attempts have been made to produce scanning systems that can detect certain materials (such as explosives or narcotics) in various items (such as luggage). However, these attempts have generally failed when attempting to scan items "in the open" without the use of radio frequency (RF) shielded containers. Instead, these attempts required that items be placed inside a shielded container. Moreover, the scan times used in these attempts have been quite long, often around one minute or longer. In addition, these attempts are often susceptible to and hindered by RF interference (RFI) in the ambient environment.

SUMMARY

This disclosure relates to a material detection system.

In a first embodiment, a method includes transmitting first radio frequency (RF) signals towards an item through open space. The method also includes receiving second RF signals from the item through open space, where the second RF signals have one or more characteristics indicative of one or more materials within the item. In addition, the method includes processing the second RF signals to identify the one or more materials within the item using nuclear quadrupole resonance (NQR) spectrometry.

In a second embodiment, an apparatus includes a transmit chain configured to transmit first RF signals towards an item through open space. The apparatus also includes a receive chain configured to receive second RF signals from the item through open space, where the second RF signals have one or more characteristics indicative of one or more materials within the item. The apparatus further includes at least one processing device configured to process the second RF signals to identify the one or more materials within the item using NQR spectrometry.

In a third embodiment, a system includes a table and a material detection system. The material detection system includes a transmit chain configured to generate first RF signals and a transmit probe configured to transmit the first RF signals towards an item through open space. The material detection system also includes a receive probe configured to receive second RF signals from the item through open space, where the second RF signals have one or more characteristics indicative of one or more materials within the item. The material detection system further includes a receive chain configured to process the second RF signals and at least one processing device configured to identify the one or more materials within the item using NQR spectrometry based on the processed second RF signals. The transmit and receive probes are positioned in an upper portion of the table.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
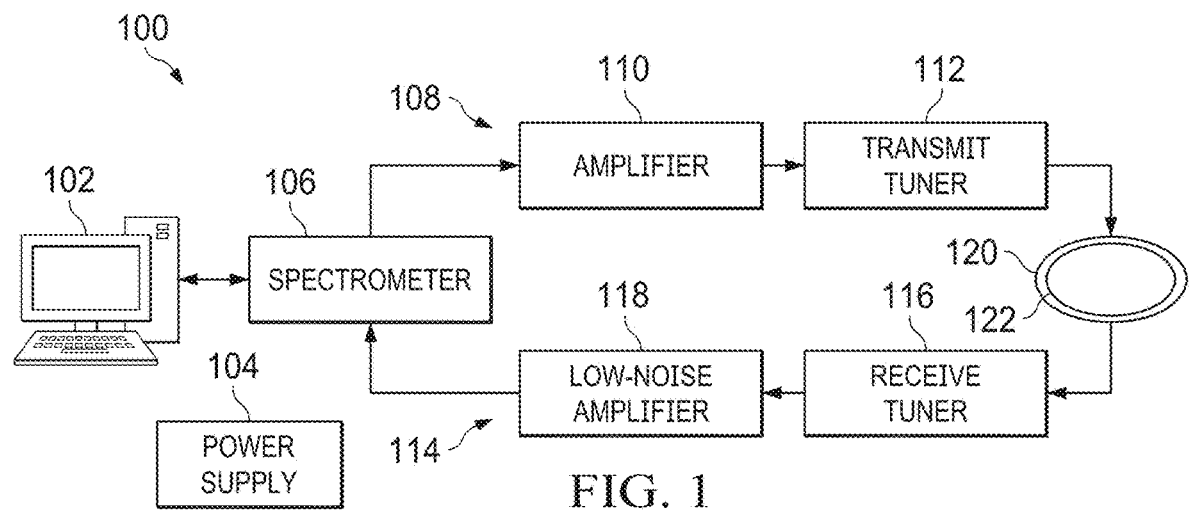
FIG. 1 illustrates an example material detection system according to this disclosure.

FIGS. 1 through 11, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, several attempts have been made to produce scanning systems that can detect certain materials (such as explosives or narcotics) in various items (such as luggage). However, these attempts have generally failed when attempting to scan items "in the open" without the use of radio frequency (RF) shielded containers. Instead, these attempts required that items be placed inside a shielded container. Moreover, the scan times used in these attempts have been quite long, often around one minute or longer. In addition, these attempts are often susceptible to and hindered by RF interference (RFI) in the ambient environment.

This disclosure is directed to various explosives, narcotics, or other material detection systems. Each material detection system is configured to rapidly scan items for explosives, narcotics, or other materials hidden or otherwise located within the items. The items that are scanned can vary widely based on the actual implementation of a specific material detection system. In some embodiments, for example, a material detection system can be implemented as a table scanner used in a travel security setting like an airport, in which case the material detection system may scan numerous items such as baggage, boxes, pelican cases, and backpacks (just to name a few). As a particular example, when implemented as a table scanner, the material detection system may be configured to rapidly scan numerous types of items placed on top of a table. Other types of material detection systems may also be implemented, such as material detection systems used to scan vehicles, cargo containers, or people. Each material detection system may be implemented at a fixed location, in a handheld or other portable device, on a vehicle, or in any other suitable manner.

Each material detection system uses a Nuclear Quadrupole Resonance (NQR) sensor probe, which may be placed under a tabletop or otherwise placed in the vicinity of items to be scanned. Because NQR uses lower-frequency RF signals, the tabletop or other housing structure is transparent to both "sense/exciting" signals that are transmitted from the sensor probe and response signals that are returned from target substances. Both types of signals also penetrate not only the tabletop or other housing structure but also most items being scanned. NQR is a proven technique where RF signals can be used to detect and uniquely identify materials such as many types of explosives and narcotics. Through the passive reduction or cancellation of RF interference, it is possible to build large sensors based on NQR. The passive RFI suppression in the material detection systems also enables large systems to operate without shielded containers. In some embodiments, the transmission of a sense/exciting signal towards an item is separated from the reception of a response signal from the item, helping to improve RF interference insensitivity. Among other things, the separation of the two functions facilitates the use of the transmit portion of the material detection system to enable additional RFI suppression processing. This also enables the use of the material detection system in an open environment without the use of a shielding enclosure, thereby making implementations such as tabletop systems and other "out in the open" implementations feasible.

In this way, scanning by each of the material detection systems is non-contact, rapid, and unambiguous when a target substance is detected. For example, a material detection system implemented as a table scanner in a travel security setting may scan each item in about one second, even in the presence of varying internal contents (such as clothing, electronics, toiletries, etc.). As another example, a material detection system may unambiguously identify various explosives like Composition-4 (C4), pentaerythritol tetranitrate (PENT), trinitrotoluene (TNT), octogen (HMX), hexogen (RDX), and Semtex (a combination of PENT and RDX), as well as other chemicals or materials like potassium chlorate, ammonium nitrate, cocaine, and heroin. Also, the material detection systems can be safe for human scanning, have low false alarm rates, contain no moving parts, and/or be scalable in size to support multiple configurations (such as the ability to scan items of different sizes). Further, items can be scanned without needing to remove the contents of the items, which supports the scanning of items "in the open" without the use of RF shielded containers. This may be particularly useful when scanning items in airports, bus or boat terminals, cargo terminals, or other locations. In addition, RFI in the ambient environment can be suppressed or otherwise excluded, enabling use of the material detection systems in a large number of applications. Finally, since the material detection systems may require no RF shielding to achieve rapid detection of hidden explosives or other materials, the systems may operate in environments alongside other equipment like signal jammers.

This type of functionality may be used in various locations, such as civilian transportation centers (like airports and other travel terminals) or military base entry points. Among other things, the functionality may be used to help identify smuggling attempts, such as the transport of illicit materials across borders or through specific locations. The functionality may also be used to help identify explosives at checkpoints or other locations, where the explosives may be hidden under clothing, in bags/packages/vehicles, buried, or even located inside people. As can be seen here, the material detection systems are able to effectively detect one or more specified materials even in the presence of various types of barriers. While RF noise from a wide variety of sources (such as AM radio towers, jammers, and even lightning) have made previous NQR systems unsuitable for use in various scenarios, the disclosed material detection systems can operate indoors or outdoors with no additional shielding needed and can be used for rapid detection day or night.

FIG. 1 illustrates an example material detection system 100 according to this disclosure. As shown in FIG. 1, the material detection system 100 includes a user workstation or other computing device 102, a direct current (DC) power source or other power supply 104, and a spectrometer 106. The material detection system 100 also includes a transmit chain 108 having an amplifier 110 and a transmit tuner 112, as well as a receive chain 114 having a receive tuner 116 and a low-noise amplifier 118. The transmit tuner 112 is coupled to a transmit probe 120, and the receive tuner 116 is coupled to a receive probe 122.

The user workstation or other computing device 102 generally represents or supports a human-machine interface (HMI) that allows one or more users to interact with and control the material detection system 100. For example, the device 102 may allow a user to initiate scanning of one or more items or configure the material detection system 100 to automatically perform continuous scanning of items. The device 102 may also present scanning results to the user, such as by indicating whether one or more explosives, narcotics, or other specified materials have been detected. The device 102 may further analyze data from the spectrometer 106 in order to determine whether one or more specified materials have been detected in one or more items being scanned (although the spectrometer 106 itself or another device may perform this function). The device 102 includes any suitable structure configured to interact with at least one user, such as a desktop computer, laptop computer, tablet computer, or specialized computing device.

The power supply 104 generally operates to provide operating power to at least some of the other components of the material detection system 100. For example, the power supply 104 may provide operating power used to generate outgoing RF signals and process incoming RF signals. The power supply 104 includes any suitable source of electrical power, such as a DC power source or an alternating current-to-direct current (AC-DC) converter. The operating power provided by the power supply 104 may originate from any suitable source, such as an electrical grid or power generator.

The spectrometer 106 generally operates to analyze information related to wireless signals received by the material detection system 100 in order to separate and measure various spectral components. For example, the spectrometer 106 may be used to support NQR spectrometry in which RF pulses are transmitted and penetrate items being scanned (such as baggage, vehicles, cargo, or people) to excite chemicals within the items. This causes the chemicals to radiate unique RF "fingerprint" signals, where the fingerprint signals can be identified by the spectrometer 106, the device 102, or other device in order to determine whether specific chemicals are present in the items being scanned. The spectrometer 106 includes any suitable structure configured to separate and measure spectral components of signals. The spectrometer 106 may represent an "off the shelf" spectrometer or a customized spectrometer.

The transmit and receive chains 108 and 114 are respectively used to transmit and receive RF signals. For example, the transmit chain 108 may be used to generate RF signals (referred to as "sense/exciting" signals) that are transmitted through the transmit probe 120 into one or more items being scanned. The receive chain 114 may be used to receive and process RF signals (referred to as "response" signals) that are returned from the one or more items being scanned and that vary based on the chemicals or other substances in the one or more items being scanned. In this example, the amplifier 110 represents a high-power amplifier or other amplifier configured to amplify an input signal, which here is received from the spectrometer 106. The amplified signal is provided to the transmit tuner 112, which can tune to specific spectral components or different RF frequencies. Received response signals are provided to the receive tuner 116, which can tune to specific spectral components or different RF frequencies. The specific spectral components or different RF frequencies contained in the response signals are provided to the low-noise amplifier 118, which amplifies the received signals for processing by the spectrometer 106.

The amplifier 110 represents any suitable structure configured to amplify outgoing signals for wireless transmission, and the low-noise amplifier 118 represents any suitable structure configured to amplify received incoming signals while imparting little or no noise into the amplified signals. The transmit tuner 112 and the receive tuner 116 each represents any suitable structure configured to tune to one or more specific spectral components or RF frequencies and to output tuned signals. In some embodiments, the transmit tuner 112 and the receive tuner 116 may each support auto-tuning, which enables the material detection system 100 to automatically tune to different RF frequencies and thereby scan/detect multiple threat substances. The scanning for multiple threat substances may occur sequentially or simultaneously depending on the implementation. Note, however, that the transmit chain 108 and the receive chain 114 may be implemented in any other suitable manner.

The transmit probe 120 is configured to transmit outgoing wireless RF signals based on input from the transmit tuner 112, and the receive probe 122 is configured to provide incoming wireless RF signals to the receive tuner 116. The transmit probe 120 includes any suitable structure configured to transmit wireless signals, and the receive probe 122 includes any suitable structure configured to receive wireless signals. In some embodiments, the probes 120 and 122 represent nested antennas, although separate antennas may also be used here.

In some embodiments, when at least one specified material is detected within an item during operation of the material detection system 100, a display of the device 102 may provide a notification that turns from one color like green (meaning "clear" or "no specified materials detected") to another color like red (meaning "detection" or "at least one specified material detected"). The display may also identify the specified material or materials that have been detected (such as by displaying "RDX detected"), and optionally an audio alarm may be sounded. One or more additional alerts may also be distributed, such as to a Tactical Operations Center, Explosive Ordnance Disposal (EOD) or other response forces, or others. Also, in some cases, the presence of excessive metal content or other materials may block the sense/exciting signals and/or the response signals. In those instances, the device 102 (or another device) may be configured to generate an audible, visual, or other "shield alarm" (which may be similar to current X-ray/CT systems). The shield alarm can notify appropriate personnel of a potential problem with the scanning of a particular item or group of items.

Note that any other desired functionality may be implemented in the material detection system 100 as needed or desired using either the components shown in FIG. 1 or additional components. Examples of additional functions may include system health, monitoring, and built-in testing. Also, the material detection system 100 can be "ruggedized" for use in the field, meaning the material detection system 100 may be designed for use in various outdoor environments for prolonged periods of time. In addition, any testing can be expanded as needed or desired to improve system performance.

In some embodiments, the material detection system 100 overall may support the techniques disclosed in U.S. Patent Application Publication No. 2019/0195973 (hereby incorporated by reference in its entirety), which describes how one or more materials can be detected using frequency-modulated NQR signals. In general, NQR is an approach in which excitation pulses in sense/exciting signals transmitted from the probe 120 are used to excite nuclei in one or more materials of interest (if present in an item being scanned) to an excited state. The energy of the excited state depends on a magnetic field in the item. The magnetic field in the item is modulated after the excitation pulses, and the nuclei in the material(s) of interest decay from the excited state so that they emit frequency-modulated radiation. This frequency-modulated radiation is received as the response signals by the probe 122, so the response signals can be processed to determine if the one or more materials of interest are actually present in the item being scanned.

Moreover, in some embodiments, the transmit probe 120 and the receive probe 122 may be implemented as described in any of U.S. Pat. Nos. 7,714,791; 8,717,242; 9,484,632; 9,812,790; or U.S. Patent Publication No. 2018/0315539 (hereby incorporated by reference in their entirety). Further, in some embodiments, the transmit tuner 112 and the receive tuner 114 may be implemented as described in U.S. Pat. No. 10,340,965 (hereby incorporated by reference in its entirety). In addition, in some embodiments, the transmit chain 108 and the receive chain 114 may use the techniques described in U.S. Provisional Patent Application No. 62/348,392 (hereby incorporated by reference in its entirety) to support the tunable transmission and reception of wireless signals.

Although FIG. 1 illustrates one example of a material detection system 100, various changes may be made to FIG. 1. For example, the actual implementation of the material detection system 100 can vary based on a number of factors, such as the material or materials to be detected, the type or types of items to be scanned, and whether the material detection system 100 is fixed, handheld, or movable. Many of these implementations may use at least some similar or identical components to support a common architecture, although this is not necessarily required.

Figure 2:
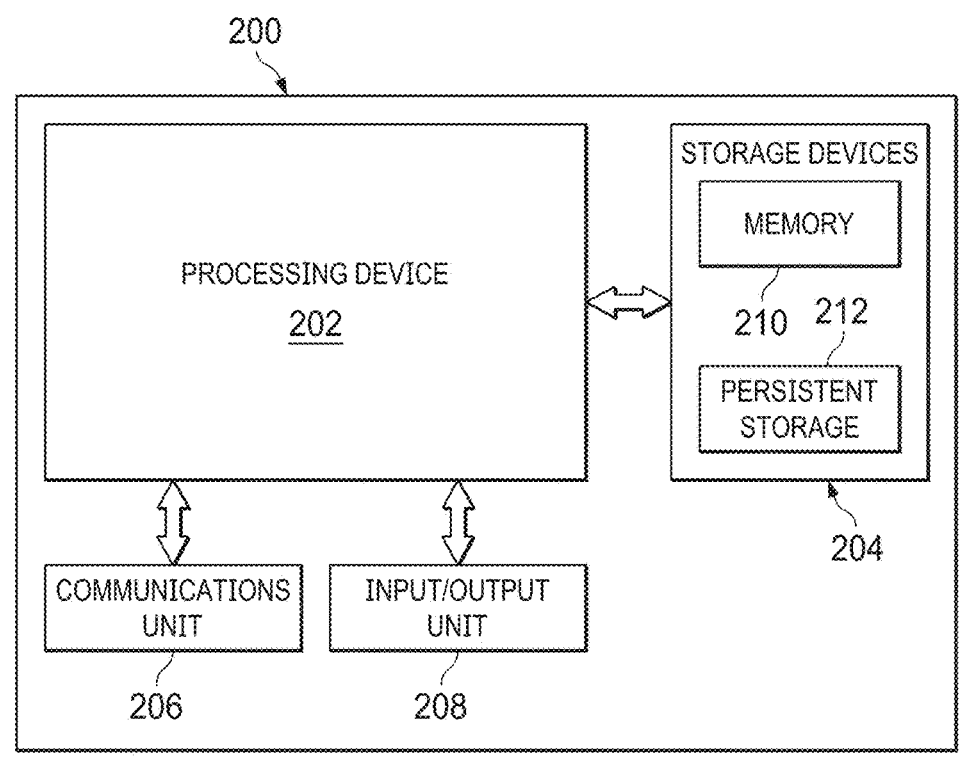
FIG. 2 illustrates an example computing device or system supporting material detection according to this disclosure.

FIG. 2 illustrates an example computing device or system 200 supporting material detection according to this disclosure. The device or system 200 may, for example, be used to implement one or more functions related to the user workstation or other computing device 102, the spectrometer 106, and/or other components of the material detection system 100.

As shown in FIG. 2, the computing device or system 200 may include at least one processing device 202, at least one storage device 204, at least one communications unit 206, and at least one input/output (I/O) unit 208. The processing device 202 may execute instructions that can be loaded into a memory 210. The processing device 202 includes any suitable number(s) and type(s) of processors or other processing devices in any suitable arrangement. Example types of processing devices 202 include one or more microprocessors, microcontrollers, digital signal processors (DSPs), application specific integrated circuits (ASICs), field programmable gate arrays (FPGAs), or discrete circuitry.

The memory 210 and a persistent storage 212 are examples of storage devices 204, which represent any structure(s) capable of storing and facilitating retrieval of information (such as data, program code, and/or other suitable information on a temporary or permanent basis). The memory 210 may represent a random access memory or any other suitable volatile or non-volatile storage device(s). The persistent storage 212 may contain one or more components or devices supporting longer-term storage of data, such as a read only memory, hard drive, Flash memory, or optical disc.

The communications unit 206 supports communications with other systems or devices. The communications unit 206 may support communications through any suitable physical or wireless communication link(s), such as a network or dedicated connection(s). As a particular example, the communications unit 206 may support communications with components used to transmit and receive RF signals (such as the transmit and receive chains 108 and 114) and/or components used to analyze RF signals (such as the spectrometer 106). The communications unit 206 includes any suitable structure configured to enable communications with one or more external components, such as a network interface card or a wireless transceiver.

The I/O unit 208 allows for input and output of data. For example, the I/O unit 208 may provide a connection for user input through a keyboard, mouse, keypad, touchscreen, or other suitable input device. The I/O unit 208 may also send output to a display or other suitable output device. Note, however, that the I/O unit 208 may be omitted if the device or system 200 does not require local I/O, such as when the device or system 200 represents a component that can be accessed remotely over a network.

Although FIG. 2 illustrates one example of a computing device or system 200 supporting material detection, various changes may be made to FIG. 2. For example, in general, computing devices and systems come in a wide variety of configurations, and FIG. 2 does not limit this disclosure to any particular device or system. Also, various components in FIG. 2 may be combined, further subdivided, replicated, omitted, or rearranged and additional components may be added according to particular needs.

Figure 3:
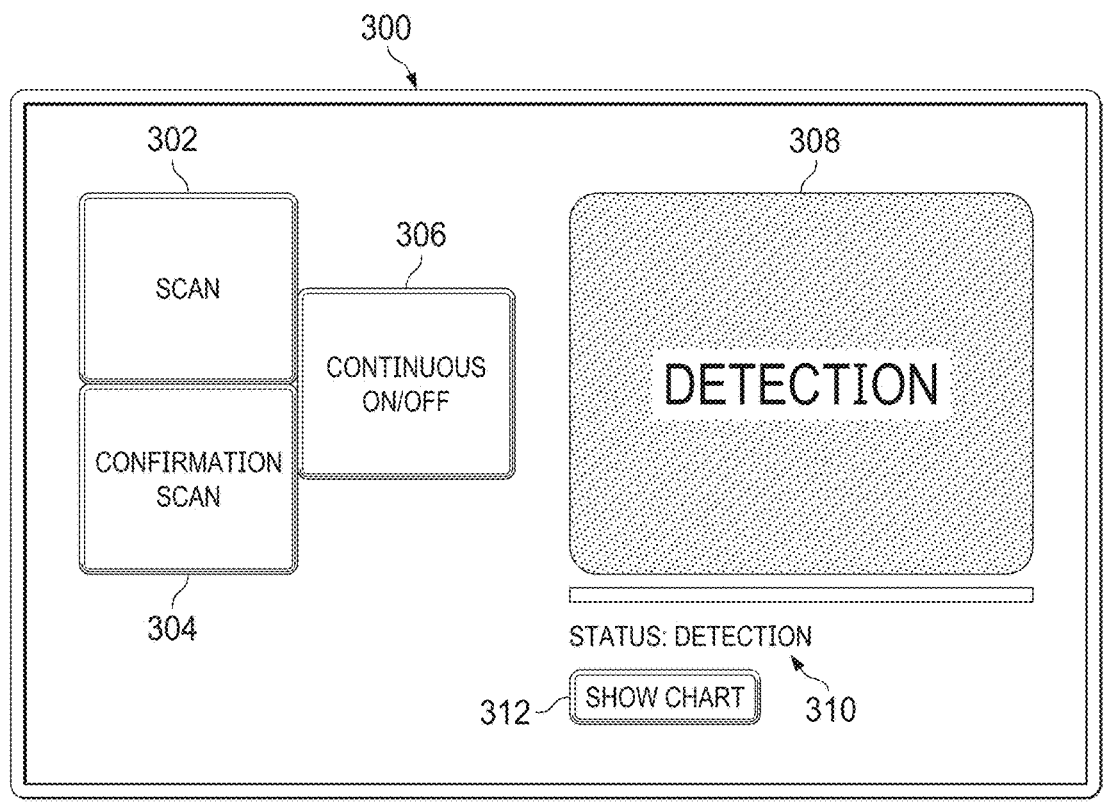
FIG. 3 illustrates an example user interface of a material detection system according to this disclosure.

FIG. 3 illustrates an example user interface 300 of a material detection system 100 according to this disclosure. The user interface 300 may, for example, be presented on a display of the user workstation or other computing device 102. However, the user workstation or other computing device 102 specifically or the material detection system 100 generally may have any other suitable user interface. Also, the user interface 300 may be used with any other suitable human-machine interface device.

As shown in FIG. 3, the user interface 300 includes various buttons 302, 304, 306 that allow a user to control the overall operating mode of the material detection system 100. In this example, the button 302 allows the user to initiate a scan of one or more items. This button 302 may be used, for example, when the material detection system 100 is not set for continuous scanning and the user waits for one or more items to be suitably positioned before initiating a scan. The button 304 allows the user to initiate a confirmation scan of one or more items. This button 304 may be used, for instance, if an initial scan of the one or more items was inconclusive or there is otherwise a desire to perform another scan of the one or more items. The confirmation scan may involve the use of more intense sense/exciting RF signals, the transmission of sense/exciting RF signals for a longer period of time, or a more detailed analysis of the return RF signals. The button 306 allows the user to toggle continuous scanning on and off, which means the user can control whether the material detection system 100 is set for continuous scanning of items.

A result indicator 308 provides a visual indication of the current scanning results. For example, the result indicator 308 may have a first color (such as green) and present first text (such as the word "clear") if no specified materials are detected in one or more items being scanned. The result indicator 308 may have a second color (such as red) and present second text (such as the word "detection") if at least one specified material has been detected in one or more items being scanned. The result indicator 308 may also provide other results, such as a "shield alarm" or other condition, and each condition may have its own unique color and text for the result indicator 308. A textual description 310 may also be included in the user interface 300 in order to provide any other desired information to a user. For instance, the textual description 310 may identify the status of the material detection system 100 or identify the current detection results, such as by identifying one or more specified materials that have actually been detected by the material detection system 100. A button 312 may be selected by the user to view a chart of information generated by the material detection system 100, such as a chart containing the spectrographic characteristics of response signals as measured by the spectrometer 106.

Although FIG. 3 illustrates one example of a user interface 300 of a material detection system 100, various changes may be made to FIG. 3. For example, the user interface 300 may present any other or additional information to a user and receive any other or additional information from the user as needed or desired. In general, user interfaces come in a wide variety of configurations, and FIG. 3 does not limit this disclosure to any particular user interface.

Figure 5:
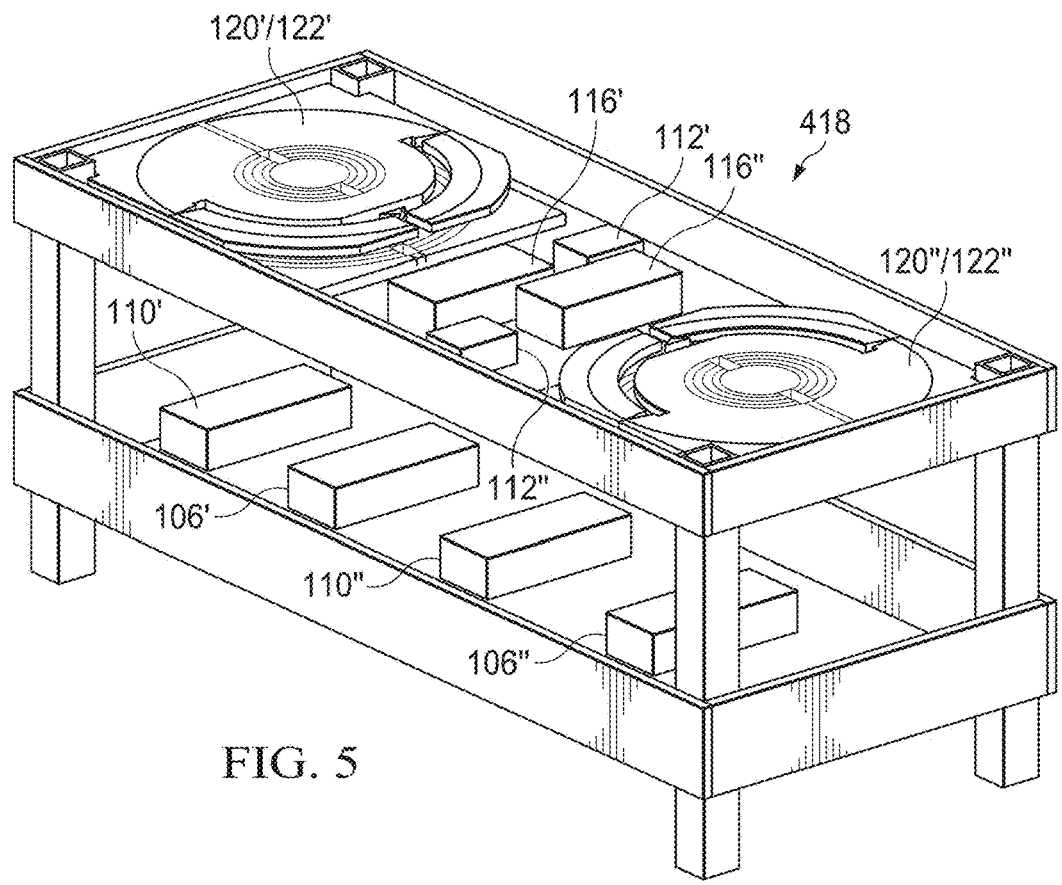
FIGS. 4 and 5 illustrate an example travel security system incorporating material detection capabilities according to this disclosure.
Figure 4:
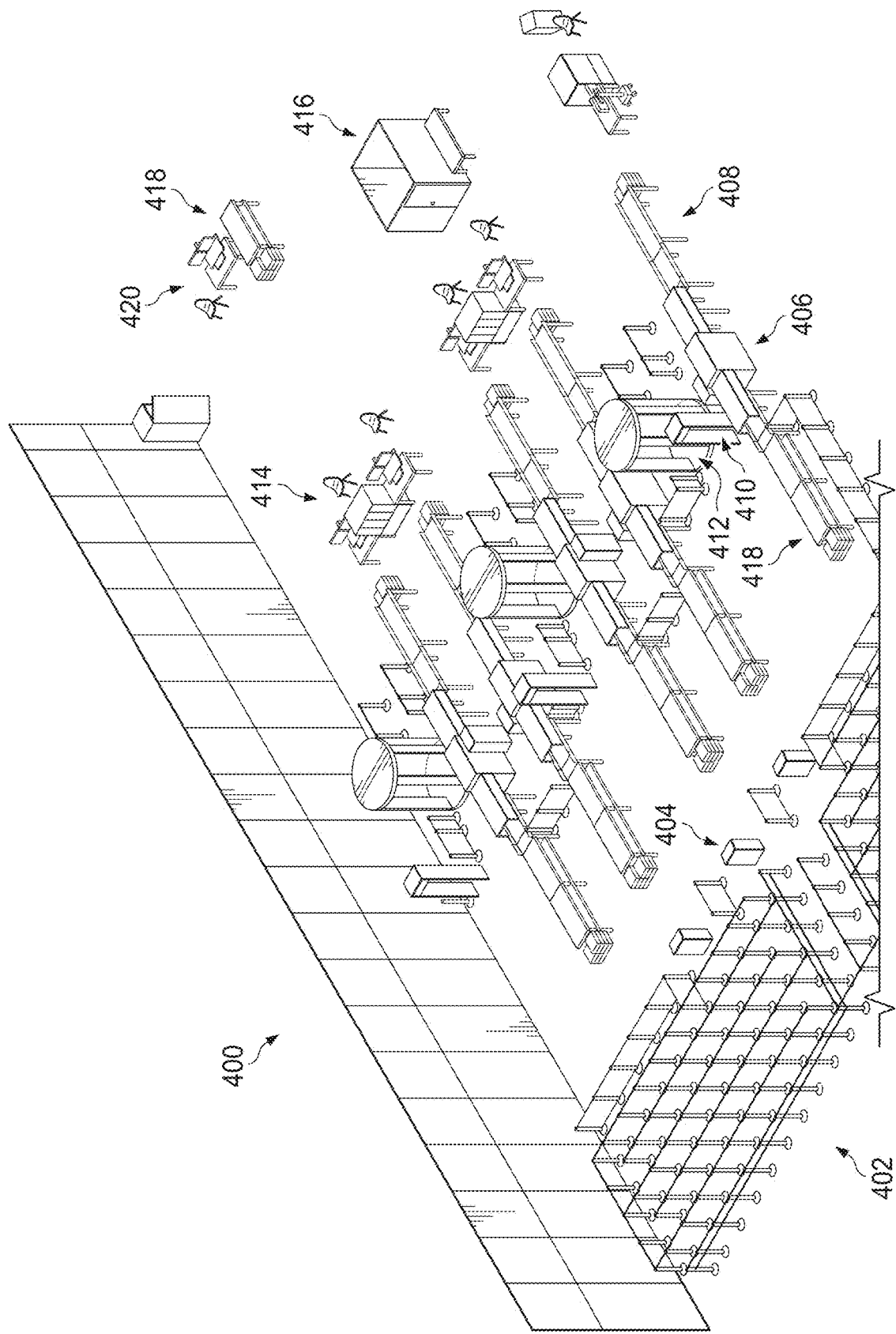

FIGS. 4 and 5 illustrate an example travel security system 400 incorporating material detection capabilities according to this disclosure. The travel security system 400 here represents a modified version of the type of security system that is common in many airports and other travel terminals (at least in the United States). As shown in FIG. 4, the travel security system 400 includes a waiting area 402, where multiple travelers may queue or wait in line. Multiple podiums 404 are positioned where security personnel (such as Transportation Security Administration or "TSA" personnel in the United States) may inspect printed or electronic travel documents (such as boarding passes), personal identification documents (such as passports and drivers' licenses), and otherwise ensure that travelers are allowed to pass. The travelers may then allow their luggage to be inspected using X-ray machines 406 and recover their luggage at recovery locations 408 after the travelers themselves have passed through X-ray machines 410 or full-body scanners 412. Inspection locations 414 may represent locations where physical samples of luggage can be captured and analyzed (such as by using swabs wiped over the luggage) or where other physical inspections or other inspections of travelers or luggage may occur. At least one specified location 416 may be provided in case travelers need to remove clothes as part of an inspection.

In this example, one or more scanning tables 418 may be provided at one or more locations in the travel security system 400. Each scanning table 418 may include at least one instance of the material detection system 100. In this example, the scanning tables 418 are provided before luggage is placed into the X-ray machines 406. This may allow, for example, the scanning tables 418 to be used to scan luggage that is waiting to be passed through the X-ray machines 406. Note, however, that the scanning tables 418 may be positioned at any other or additional locations in the travel security system 400. Also note that in whatever position(s), user interfaces for the scanning tables 418 (such as user interfaces 300) may be positioned where travelers can see the scanning results, or the user interfaces for the scanning tables 418 may be obscured from the travelers' view and viewed only by security personnel or other authorized personnel. At least one additional scanning table 418 may be located at a secondary inspection site 420, which may represent an area where another NQR-based or other inspection may be performed. For instance, if a "shield alarm" or other alarm is issued for a particular item, the item may be inspected at the secondary inspection site 420 in a more detailed manner.

One specific example implementation of the scanning table 418 is shown in FIG. 5, where upper and side surfaces of the scanning table 418 have been removed for illustration purposes. As can be seen in FIG. 5, the scanning table 418 includes two instances of the material detection system 100. One instance of the material detection system 100 includes a spectrometer 106', an amplifier 110', a transmit tuner 112', a receive tuner 116', and transmit and receive probes 120'/122'. Another instance of the material detection system 100 includes a spectrometer 106", an amplifier 110", a transmit tuner 112", a receive tuner 116", and transmit and receive probes 120"/122". Other components of each instance of the material detection system 100 (such as a power supply 104 and an amplifier 118) may be positioned elsewhere in the scanning table 418 and are not visible in FIG. 5.

In some embodiments, different instances of the material detection system 100 in the scanning table 418 may be used to scan for different types of materials. For example, one instance of the material detection system 100 may scan for one or more specific types of explosives or other materials, and another instance of the material detection system 100 may scan for one or more other specific types of explosives or other materials. In this case, a traveler may be instructed to pass his or her luggage or other items over both instances of the material detection system 100 in the scanning table 418. In other embodiments, different instances of the material detection system 100 in the scanning table 418 may be used to scan for one or more common types of materials. For instance, each instance of the material detection system 100 may scan for the same type(s) of explosives or other material(s). In that case, a traveler may be instructed to place his or her luggage or other items over at least one instance of the material detection system 100 in the scanning table 418.

The actual configuration of the table 418 can easily vary based on the intended material(s) to be detected and the arrangement of the security system 400. Also, each instance of the material detection system 100 may have its own user workstation or other computing device 102, or multiple instances of the material detection system 100 may be coupled to the same user workstation or other computing device 102 (in which case the device 102 may include a user interface that identifies which material detection system 100 detects one or more materials).

In particular embodiments, the scanning table 418 may have substantially the same size and dimensions as a standard or other "divest" table routinely used in airports and other travel settings. This may allow the scanning tables 418 to be easily retrofitted into existing installations where divest tables are already present. This can also help to avoid the need to rearrange other equipment in the security system 400 to accommodate the scanning tables 418. However, this is not necessarily required, and each scanning table 418 may have any suitable size, shape, and dimensions (and different scanning tables 418 may have different sizes, shapes, and/or dimensions).

Note that, in this example, the scanning table 418 includes one or more sets of large probes 120'-120", 122'-122" located in the upper portion of the scanning table 418 and facing directly upwards into open air. Ordinarily, this arrangement of the probes 120'-120", 122'-122" would normally be associated with the worst case of RF interference. However, by using the approaches described in several of the patent documents incorporated by reference above (such as U.S. Pat. No. 9,812,790; U.S. Patent Publication No. 2018/0315539; or U.S. Provisional Patent Application No. 62/348,392), it is possible to suppress the level of noise to enable the use of various NQR sensor probes, including large sensor probes facing open air.

Figure 6:
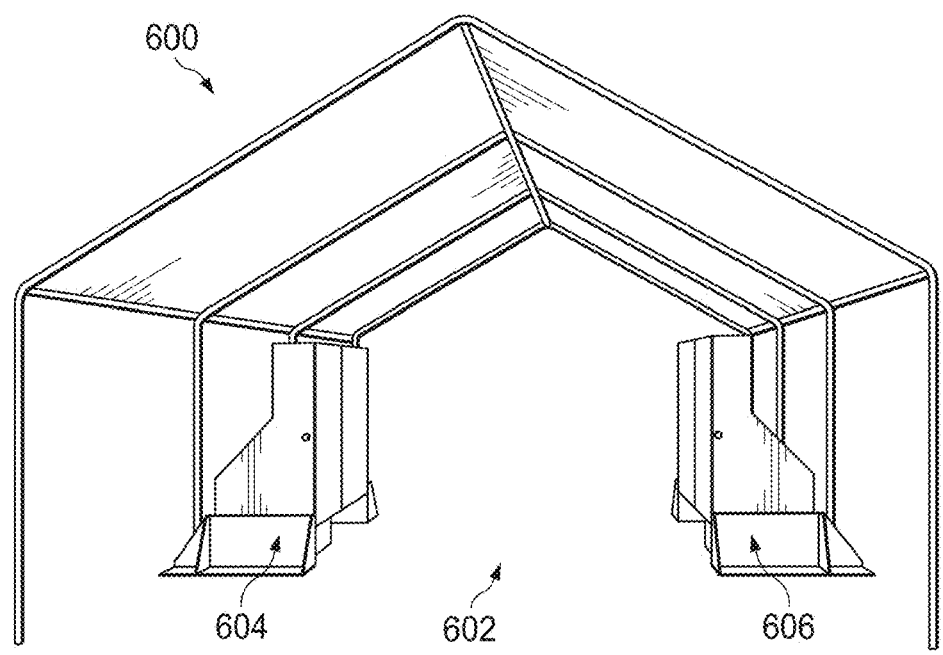
FIG. 6 illustrates an example vehicle inspection system incorporating material detection capabilities according to this disclosure.

FIG. 6 illustrates an example vehicle inspection system 600 incorporating material detection capabilities according to this disclosure. As shown in FIG. 6, the vehicle inspection system 600 defines a space 602 positioned between two material inspection systems 604 and 606. The space 602 in this example is sized and shaped to permit vehicles, such as cars, trucks, sport utility vehicles (SUVs), or tractor-trailers, to drive between the material inspection systems 604 and 606. Each of the material inspection systems 604 and 606 may include one or more instances of the material detection system 100, which are used to inspect the vehicles driving or otherwise positioned between the material inspection systems 604 and 606.

Figure 7:
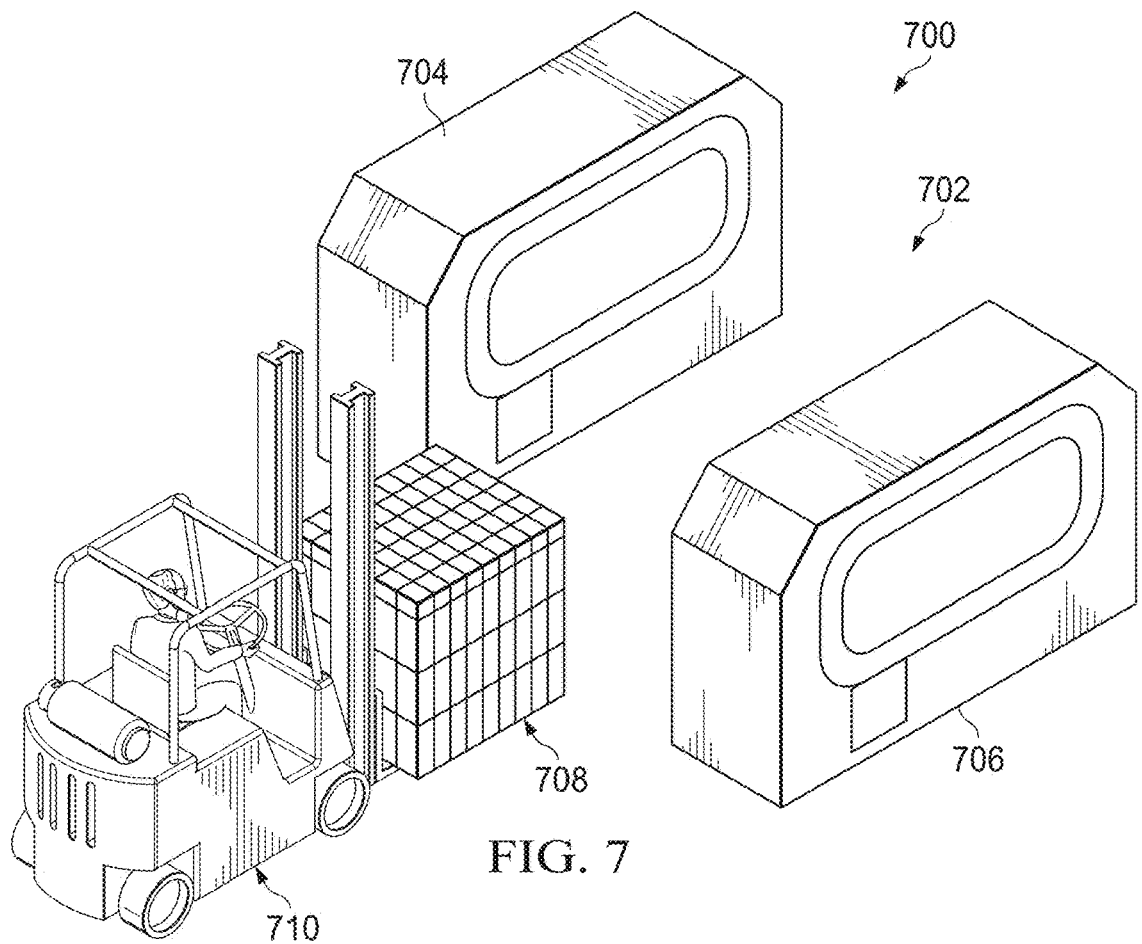
FIG. 7 illustrates an example cargo inspection system incorporating material detection capabilities according to this disclosure.

FIG. 7 illustrates an example cargo inspection system 700 incorporating material detection capabilities according to this disclosure. As shown in FIG. 7, the cargo inspection system 700 defines a space 702 positioned between two material inspection systems 704 and 706. The space 702 in this example is sized and shaped to permit cargo 708, such as pallets of items carried by a forklift 710, to move between the material inspection systems 704 and 706. Each of the material inspection systems 704 and 706 may include one or more instances of the material detection system 100, which are used to inspect the cargo moving or otherwise positioned between the material inspection systems 704 and 706.

Figure 8:
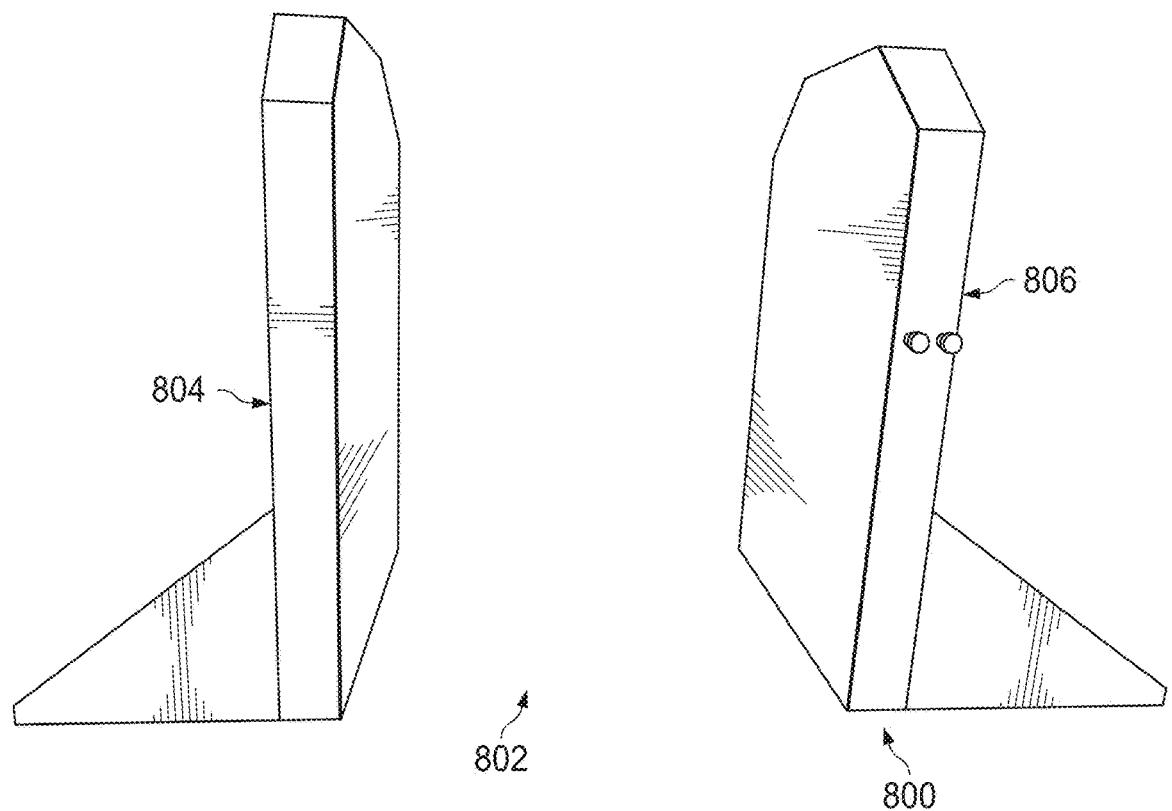
FIG. 8 illustrates an example personal inspection system incorporating material detection capabilities according to this disclosure.

FIG. 8 illustrates an example personal inspection system 800 incorporating material detection capabilities according to this disclosure. As shown in FIG. 8, the personal inspection system 800 defines a space 802 positioned between two material inspection systems 804 and 806. The space 802 in this example is sized and shaped to permit people to walk between the material inspection systems 804 and 806. Each of the material inspection systems 804 and 806 may include one or more instances of the material detection system 100, which are used to inspect the people walking or otherwise positioned between the material inspection systems 804 and 806.

Figure 9A:
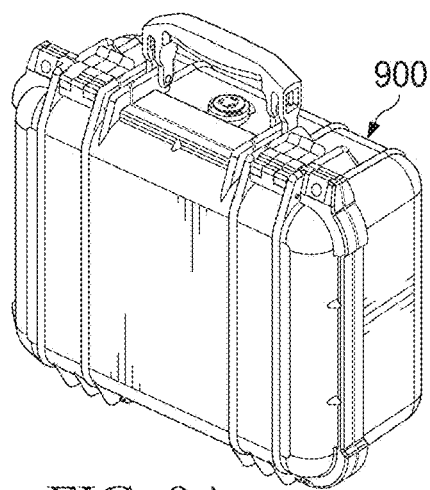
FIGS. 9A and 9B illustrate example handheld inspection systems incorporating material detection capabilities according to this disclosure.
Figure 9B:
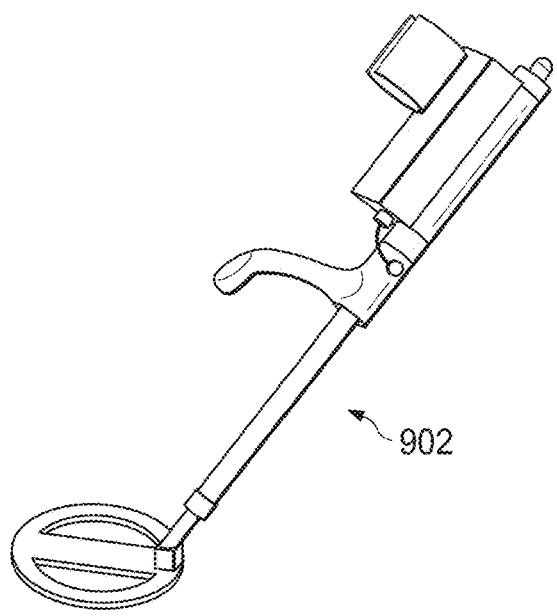

FIGS. 9A and 9B illustrate example handheld inspection systems 900 and 902 incorporating material detection capabilities according to this disclosure. As shown in FIG. 9A, the handheld inspection system 900 is implemented in the form of a suitcase-type structure and incorporates one or more instances of the material detection system 100. For example, the one or more instances of the material detection system 100 may be configured to transmit and receive RF signals through one or both of the larger sides of the suitcase-type structure. This form of the handheld inspection system 900 may (among other things) allow for easy transport of the material detection system(s) 100 and possibly inconspicuous use of the material detection system(s) 100. As shown in FIG. 9B, the handheld inspection system 950 is implemented in the form of a metal detector-type structure and incorporates one or more instances of the material detection system 100. For instance, the one or more instances of the material detection system 100 may be configured to transmit and receive RF signals through the bottom of the metal detector-type structure. This form of the handheld inspection system 950 may (among other things) allow for use of the material detection system(s) 100 in detecting certain items, such as buried mines or other explosives, under the ground.

Figure 10A:
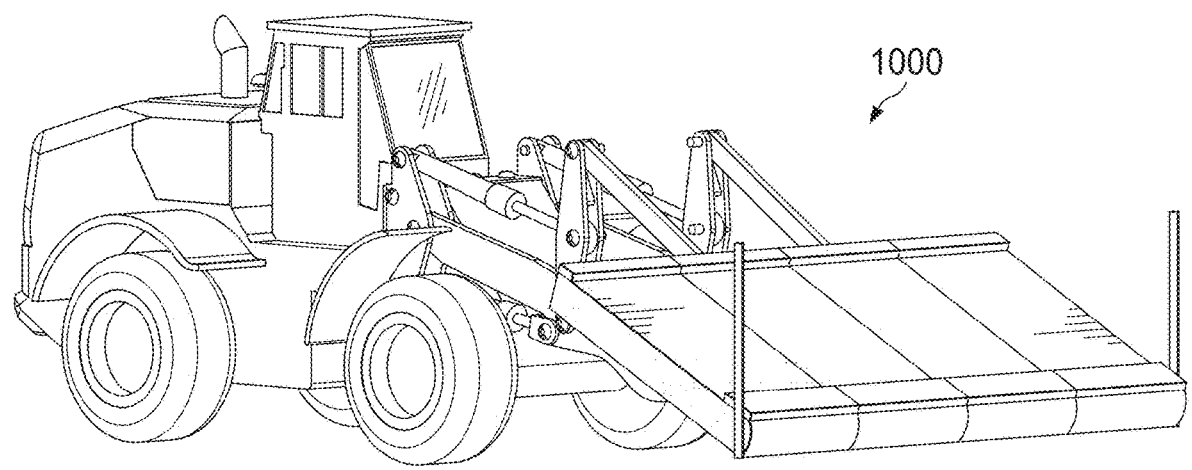
FIGS. 10A and 10B illustrate example vehicle-mounted inspection systems incorporating material detection capabilities according to this disclosure.
Figure 10B:
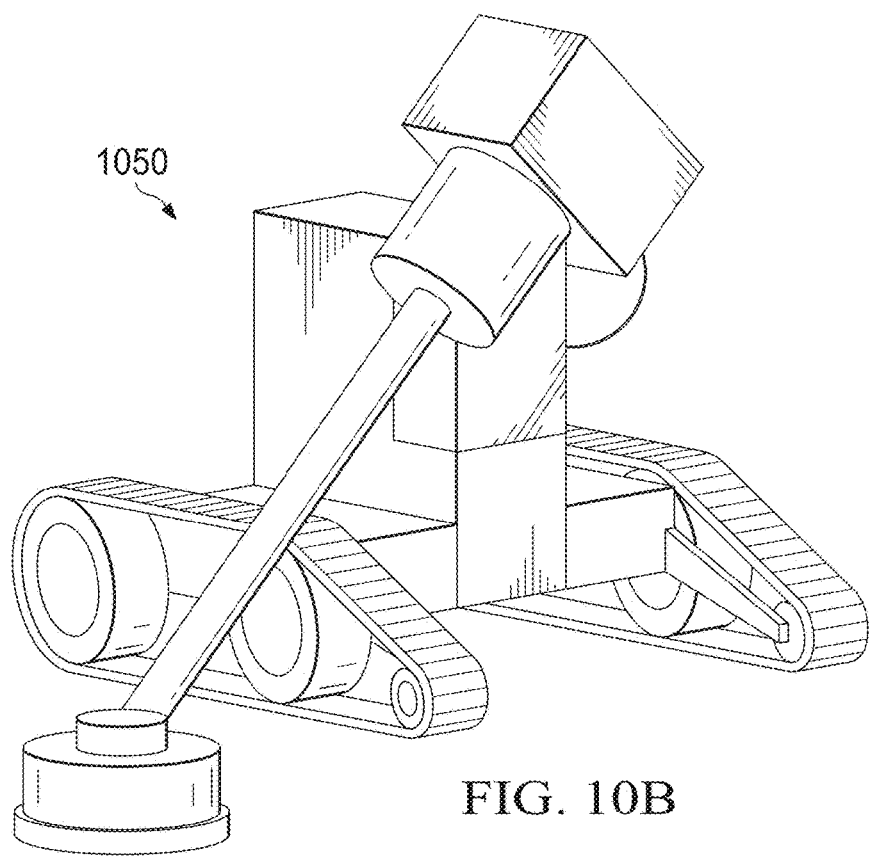

FIGS. 10A and 10B illustrate example vehicle-mounted inspection systems 1000 and 1050 incorporating material detection capabilities according to this disclosure. In FIG. 10A, the vehicle-mounted inspection system 1000 is positioned on a retractable portion of a larger vehicle, where the retractable portion in this example is located in front of the vehicle. In FIG. 10B, the vehicle-mounted inspection system 1050 is positioned at the end of a rotatable portion of a smaller vehicle. In both cases, each of the vehicle-mounted inspection systems 1000 and 1050 incorporates one or more instances of the material detection system 100. This may allow, for example, the vehicles (or any other suitable moving platforms) to be used in various applications, such as the detection of buried mines, confirmation of targets detected by ground-penetrating radar, or detection of buried chemicals.

Although FIGS. 4 through 10B illustrate various examples of inspection systems incorporating material detection capabilities, various changes may be made to FIGS. 4 through 10B. For example, one or more instances of the material detection system 100 may be used in any other suitable manner. Also, luggage, vehicles, cargo, people, ground areas, or any other items may be inspected using one or more instances of the material detection system 100 in any other suitable manner. Thus, FIGS. 4 through 10B do not limit the use of the material detection system 100 to the specific examples shown here. The material detection system 100 may be used in any other suitable manner, such as when implemented as a shoe or other footwear scanner, a postal or other package inspection scanner, or other inspection system.

Figure 11:
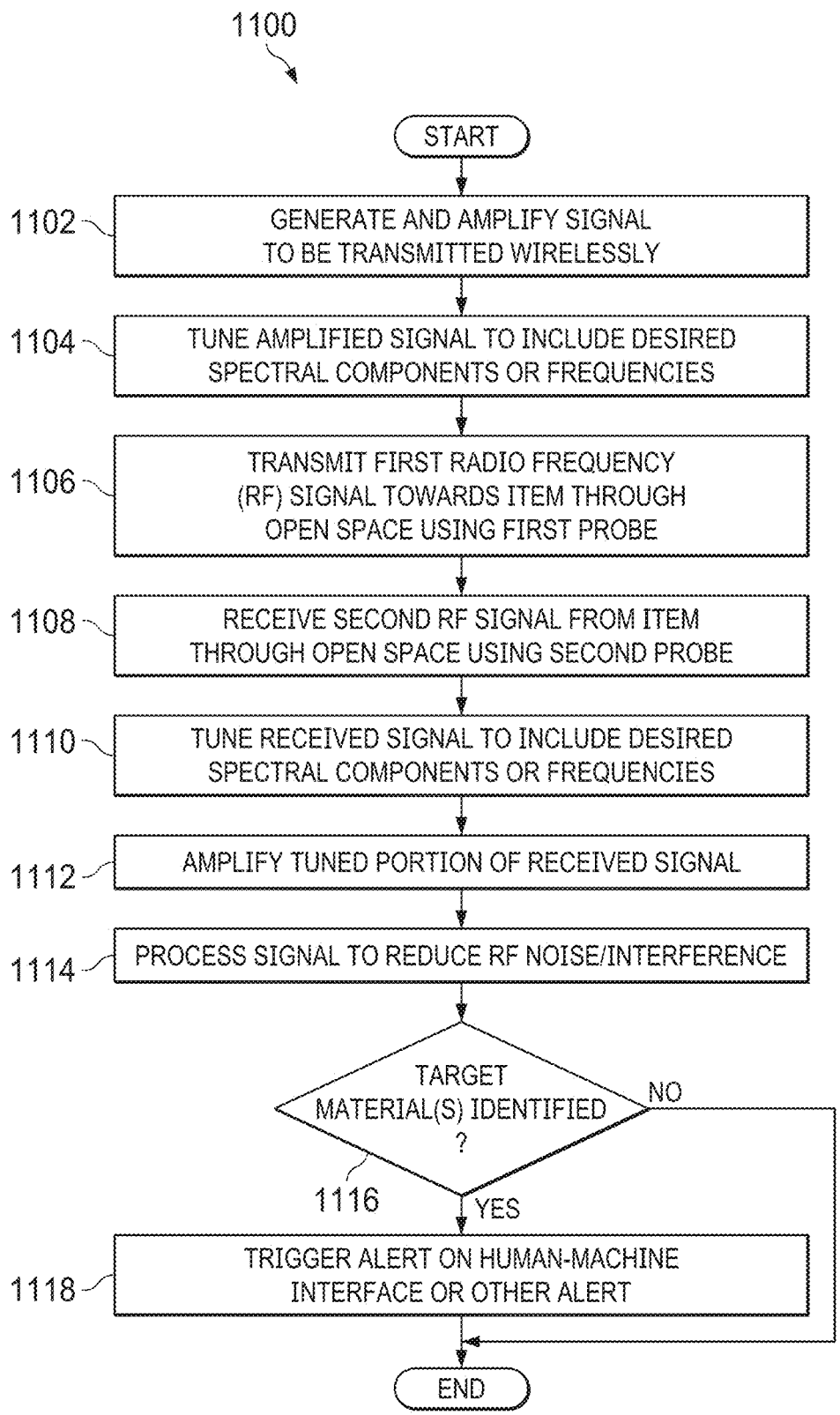
FIG. 11 illustrates an example method for material detection according to this disclosure.

FIG. 11 illustrates an example method 1100 for material detection according to this disclosure. For ease of explanation, the method 1100 is described as involving the use of the material detection system 100 shown in FIG. 1, which may include or be used in conjunction with the device or system 200 shown in FIG. 2. However, the method 1100 may involve the use of any other material detection system designed in accordance with this disclosure.

As shown in FIG. 11, a signal to be transmitted wirelessly is generated and amplified at step 1102. This may include, for example, the spectrometer 106 or other source generating an RF signal containing desired pulses. This may also include the amplifier 110 amplifying the RF signal. The amplified signal is tuned to include desired spectral components or RF frequencies at step 1104. This may include, for example, the transmit tuner 112 tuning the amplified RF signal. First RF signals are transmitted towards one or more items being scanned through open space using a first probe at step 1106. This may include, for example, the transmit probe 120 radiating RF wireless signals as sense/exciting signals based on the output of the transmit tuner 112.

Second RF signals are received from the one or more items being scanned through open space using a second probe at step 1108. This may include, for example, the receive probe 122 receiving response signals from the one or more items, where the response signals are based on the sense/exciting signals interacting with the one or more items. The received signals are tuned to include desired spectral components or RF frequencies at step 1110. This may include, for example, the receive tuner 116 tuning the received RF signals. The tuned portion of the received signals is amplified at step 1112. This may include, for example, the low-noise amplifier 118 amplifying the output of the receive tuner 116.

The amplified and tuned portion of the received signals is processed to reduce RF noise or interference at step 1114. This may include, for example, the spectrometer 106 or other device performing any suitable noise or interference suppression technique. Note that some of the patent documents incorporated by reference above describe techniques in which RFI or other RF noise can be suppressed, at least in part, using the design or operation of the probes 120 and 122. In that case, there may be little or no need for further processing of the amplified and tuned portion of the received signals.

A determination is made whether one or more specified or target materials are identified in the one or more items being scanned at step 1116. This may include, for example, the spectrometer 106, device 102, or other device determining whether the spectral content of the received RF signals (as determined by the spectrometer 106) indicates the presence of one or more explosives, narcotics, or other specified materials. The presence of one or more specified materials can be detected here using NQR performed by the material detection system 100, which as noted above is unambiguous and has a low false alarm rate. If one or more specified or target materials are identified, an alert on a human-machine interface or other alert is triggered at step 1118. This may include, for example, causing the user interface 300 to alter the result indicator 308 to indicate that one or more target materials have been detected. This may also optionally include causing the user interface 300 to alter the result indicator 308 or the textual description 310 to identify the specific material(s) detected. This may further include transmitting an alert or other information to a Tactical Operations Center, response/EOD forces, or other destinations.

Although FIG. 11 illustrates one example of a method 1100 for material detection, various changes may be made to FIG. 11. For example, while shown as a series of steps, various steps in FIG. 11 may overlap, occur in parallel, occur in a different order, or occur any number of times. Also, various steps in FIG. 5 may be omitted or additional steps may be added as needed or desired.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   transmitting first radio frequency (RF) signals towards an item through open space;
   receiving second RF signals from the item through open space, the second RF signals having one or more characteristics indicative of one or more materials within the item; and
   processing the second RF signals to identify the one or more materials within the item using nuclear quadrupole resonance (NQR) spectrometry;
   wherein the first RF signals are transmitted towards the item using a first probe;
   wherein the second RF signals are received from the item using a second probe; and
   wherein one of the probes is nested within another of the probes.

2. The method of claim 1, wherein transmitting the first RF signals comprises:
   amplifying a signal containing pulses;
   tuning the amplified signal to include first desired spectral components or RF frequencies; and
   radiating the tuned, amplified signal as the first RF signals using the first probe.

3. The method of claim 2, wherein processing the second RF signals comprises:
   tuning the second RF signals to include second desired spectral components or RF frequencies; and
   amplifying the tuned second RF signals.

4. The method of claim 1, wherein processing the second RF signals comprises:
   analyzing the second RF signals using a spectrometer to isolate one or more spectral components of the second RF signals, the one or more spectral components of the second RF signals associated with the one or more materials within the item.

5. The method of claim 1, wherein:
   multiple material inspection systems are each configured to transmit the first RF signals towards the item and receive the second RF signals from the item;
   the material inspection systems are separated from one another by a space; and
   the item is positioned between the material inspection systems within the space.

6. The method of claim 1, wherein the item is not placed within a shielded container during the transmission of the first RF signals and the reception of the second RF signals.

7. A method comprising:
   transmitting first radio frequency (RF) signals towards an item through open space;
   receiving second RF signals from the item through open space, the second RF signals having one or more characteristics indicative of one or more materials within the item; and
   processing the second RF signals to identify the one or more materials within the item using nuclear quadrupole resonance (NQR) spectrometry;
   wherein the first RF signals are transmitted towards the item using a first probe;
   wherein the second RF signals are received from the item using a second probe; and
   wherein the first and second probes are located in an upper portion of a table, the item positioned on the table.

8. An apparatus comprising:
   a transmit chain configured to transmit first radio frequency (RF) signals towards an item through open space and comprising a first probe;

a receive chain configured to receive second RF signals from the item through open space and comprising a second probe, the second RF signals having one or more characteristics indicative of one or more materials within the item; and at least one processing device configured to process the second RF signals to identify the one or more materials within the item using nuclear quadrupole resonance (NQR) spectrometry;

wherein one of the probes is nested within another of the probes.

9. The apparatus of claim 8, wherein the transmit chain comprises:
a first amplifier configured to amplify a signal containing pulses;
a transmit tuner configured to tune the amplified signal to include first desired spectral components or RF frequencies; and
the first probe that is configured to radiate the tuned, amplified signal as the first RF signals.

10. The apparatus of claim 9, wherein the receive chain comprises:
the second probe that is configured to receive the second RF signals;
a receive tuner configured to tune the second RF signals to include second desired spectral components or RF frequencies; and
a second amplifier configured to amplify the tuned second RF signals.

11. The apparatus of claim 8, further comprising:
a spectrometer configured to isolate one or more spectral components of the second RF signals, the one or more spectral components of the second RF signals associated with the one or more materials within the item.

12. The apparatus of claim 8, wherein:
the first probe is configured to transmit the first RF signals towards the item;
the second probe is configured to receive the second RF signals from the item; and
the first and second probes are located in an upper portion of a table.

13. The apparatus of claim 8, wherein:
the apparatus comprises multiple material inspection systems;
each of the multiple material inspection systems is configured to transmit the first RF signals towards the item and receive the second RF signals from the item; and
the material inspection systems are separated from one another by a space.

14. The apparatus of claim 8, wherein the at least one processing device is configured to identify the one or more materials within the item while the item is not within a shielded container.

15. A system comprising:
a table; and
a material detection system comprising:
a transmit chain configured to generate first radio frequency (RF) signals;
a transmit probe configured to transmit the first RF signals towards an item through open space;
a receive probe configured to receive second RF signals from the item through open space, the second RF signals having one or more characteristics indicative of one or more materials within the item;
a receive chain configured to process the second RF signals; and
at least one processing device configured to identify the one or more materials within the item using nuclear quadrupole resonance (NQR) spectrometry based on the processed second RF signals;
wherein the transmit and receive probes are positioned in an upper portion of the table; and
wherein one of the probes is nested within another of the probes.

16. The system of claim 15, wherein the system comprises multiple material detection systems, the material detection systems having transmit and receive probes positioned side-by-side in the upper portion of the table.

17. The system of claim 16, wherein the material detection systems are configured to detect different materials within the item.

18. The system of claim 15, wherein the transmit chain comprises:
a first amplifier configured to amplify a signal containing pulses; and
a transmit tuner configured to tune the amplified signal to include first desired spectral components or RF frequencies, the transmit probe configured to radiate the tuned, amplified signal as the first RF signals.

19. The system of claim 18, wherein the receive chain comprises:
a receive tuner configured to tune the second RF signals to include second desired spectral components or RF frequencies; and
a second amplifier configured to amplify the tuned second RF signals.

20. A system comprising:
a table; and
a material detection system comprising:
a transmit chain configured to generate first radio frequency (RF) signals;
a transmit probe configured to transmit the first RF signals towards an item through open space;
a receive probe configured to receive second RF signals from the item through open space, the second RF signals having one or more characteristics indicative of one or more materials within the item;
a receive chain configured to process the second RF signals; and
at least one processing device configured to identify the one or more materials within the item using nuclear quadrupole resonance (NQR) spectrometry based on the processed second RF signals;
wherein the transmit and receive probes are positioned in an upper portion of the table; and
wherein the transmit and receive probes face upwards in the upper portion of the table.

* * * * *